(12) United States Patent
Matsushita et al.

(10) Patent No.: US 7,864,021 B2
(45) Date of Patent: Jan. 4, 2011

(54) INTEGRATED CIRCUIT DEVICE

(75) Inventors: Kenichi Matsushita, Tokyo (JP); Ichiro Omura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 13 days.

(21) Appl. No.: 12/269,396

(22) Filed: Nov. 12, 2008

(65) Prior Publication Data
US 2009/0128279 A1 May 21, 2009

(30) Foreign Application Priority Data
Nov. 19, 2007 (JP) .............................. 2007-299481

(51) Int. Cl.
*H01F 27/28* (2006.01)
*H01F 5/00* (2006.01)
*G05F 1/00* (2006.01)

(52) U.S. Cl. ................. 336/222; 336/200; 336/223; 336/232; 323/282

(58) Field of Classification Search ................. None
See application file for complete search history.

(56) References Cited

U.S. PATENT DOCUMENTS

| | | | |
|---|---|---|---|
| 6,278,264 B1 * | 8/2001 | Burstein et al. | 323/282 |
| 6,380,727 B1 * | 4/2002 | Jitaru | 324/117 R |
| 6,404,192 B1 * | 6/2002 | Chiesi et al. | 324/253 |
| 6,683,510 B1 * | 1/2004 | Padilla | 333/25 |
| 7,129,692 B2 | 10/2006 | Omura et al. | |
| 7,385,375 B2 * | 6/2008 | Rozman | 323/224 |
| 7,629,860 B2 * | 12/2009 | Liu et al. | 333/25 |
| 2002/0109573 A1 * | 8/2002 | Iwanami | 336/232 |
| 2004/0178876 A1 * | 9/2004 | Koizumi et al. | 336/200 |
| 2005/0195061 A1 * | 9/2005 | Terrovitis | 336/200 |
| 2006/0164057 A1 * | 7/2006 | Kudo et al. | 323/282 |
| 2007/0045773 A1 * | 3/2007 | Mi et al. | 257/531 |
| 2007/0090912 A1 * | 4/2007 | Lee | 336/200 |
| 2007/0159286 A1 * | 7/2007 | Huang et al. | 336/200 |

FOREIGN PATENT DOCUMENTS

| | | |
|---|---|---|
| JP | 2000-65866 | 3/2000 |
| JP | 2006-189319 | 7/2006 |

* cited by examiner

*Primary Examiner*—Anh T Mai
*Assistant Examiner*—Mangtin Lian
(74) *Attorney, Agent, or Firm*—Oblon, Spivak, McClelland, Maier & Neustadt, L.L.P.

(57) ABSTRACT

An integrated circuit device includes: a main interconnect; and a coil located on one side of the main interconnect at a position fixed with respect to the main interconnect, the coil having a central axis extending in a direction crossing the extending direction of the main interconnect. An induction current detectable by the coil is generated due to a current flowing through the main interconnect.

8 Claims, 17 Drawing Sheets

INTEGRATED CIRCUIT DEVICE

CROSS-REFERENCE TO RELATED APPLICATIONS

This application is based upon and claims the benefit of priority from the prior Japanese Patent Application No. 2007-299481, filed on Nov. 19, 2007; the entire contents of which are incorporated herein by reference.

BACKGROUND OF THE INVENTION

1. Field of the Invention

This invention relates to an integrated circuit device capable of measuring the magnitude of a current flowing through its internal interconnect.

2. Background Art

It is conventionally desired to measure the magnitude of a current flowing through an interconnect in an integrated circuit device. This is intended to control the output current value in a power IC (integrated circuit). A method for measuring the magnitude of a current is to interpose a resistor in the current path and measure the voltage across this resistor. However, in this method, part of the power supply voltage applied to the integrated circuit device is spent to measure the current. Hence, the measurement has become difficult with the recent decrease of output voltage. By way of example, in a conventional power supply IC, the output voltage was 5 V, and the voltage used for current measurement was 50 mV. However, in a recent power supply IC for personal computers, the output voltage is approximately 1 V, and it is difficult to ensure a current-measuring voltage of 50 mV for an output voltage of 1 V. On the other hand, accurate measurement is impossible if the current-measuring voltage is reduced to approximately e.g. 10 mV in accordance with the output voltage.

Thus, there is a demand for means for measuring the magnitude of a current without intervention in the current path. One such means is a Rogowski coil (see, e.g., JP-A 2006-189319). The Rogowski coil is a ring-shaped coil in which its interconnect is wound around a ring-shaped body, and a returning lead is provided inside the coil. If a target interconnect to be measured is inserted into the ring-shaped body, an induction current is generated in the coil, and the magnitude of a current flowing through the target interconnect can be measured irrespective of the position of the target interconnect with respect to the ring-shaped body and the external magnetic field.

To use such a Rogowski coil to constantly measure the magnitude of a current flowing through the target interconnect, it is desirable to integrate the Rogowski coil and the target interconnect on the same substrate. However, there is a problem in that the Rogowski coil is difficult to integrate because its coil needs to be wound completely around the target interconnect. That is, formation of a Rogowski coil around a target interconnect in an integrated circuit device requires at least seven interconnect layers, including the target interconnect and the returning lead.

SUMMARY OF THE INVENTION

According to an aspect of the invention, there is provided an integrated circuit device including: a main interconnect; and a coil located on one side of the main interconnect at a position fixed with respect to the main interconnect, the coil having a central axis extending in a direction crossing the extending direction of the main interconnect, an induction current detectable by the coil being generated due to a current flowing through the main interconnect.

According to another aspect of the invention, there is provided an integrated circuit device in which a first interconnect layer, a first insulating layer, a second interconnect layer, a second insulating layer, and a third interconnect layer are laminated in this order, the integrated circuit device comprising: a main interconnect formed in the third interconnect layer and extending in a first direction parallel to a surface of the first interconnect layer; and a coil made of an interconnect formed in the first interconnect layer, an interconnect formed in the second interconnect layer, and a via formed in the first insulating layer, the coil having a central axis extending in a direction that is parallel to the surface of the first interconnect layer and crosses the first direction.

According to still another aspect of the invention, there is provided an integrated circuit device in which a first interconnect layer, a first insulating layer, a second interconnect layer, a second insulating layer, and a third interconnect layer are laminated in this order, the integrated circuit device comprising: a main interconnect formed in the third interconnect layer and including a first section extending in a first direction parallel to a surface of the first interconnect layer and a second section extending in the opposite direction of the first direction; a first coil made of an interconnect formed in the first interconnect layer, an interconnect formed in the second interconnect layer, and a via formed in the first insulating layer, the first coil being located directly below the first section and having a central axis extending in a second direction that is parallel to the surface of the first interconnect layer and orthogonal to the first direction; a second coil made of an interconnect formed in the first interconnect layer, an interconnect formed in the second interconnect layer, and a via formed in the first insulating layer, the second coil being located directly below the second section and having a central axis extending in the second direction; a first interconnect formed in one of the first interconnect layer and the second interconnect layer and connecting an end of the first coil on the second section side to an end of the second coil on the side farther from the first section; and a second interconnect formed in the other of the first interconnect layer and the second interconnect layer, one end of the second interconnect being connected to an end of the second coil on the first section side and the other end of the second interconnect being extracted to the side of the first section farther from the second section, the first coil having the same shape and winding direction as the second coil, and as viewed from a direction orthogonal to the surface of the first interconnect layer, the first interconnect crossing the second interconnect, and the area of a region enclosed by the first section, the first interconnect, and the second interconnect being equal to the area of a region enclosed by the second section, the first interconnect, and the second interconnect.

DETAILED DESCRIPTION OF THE INVENTION

Embodiments of the invention will now be described with reference to the drawings, beginning with a first embodiment of the invention.

Figure 1:
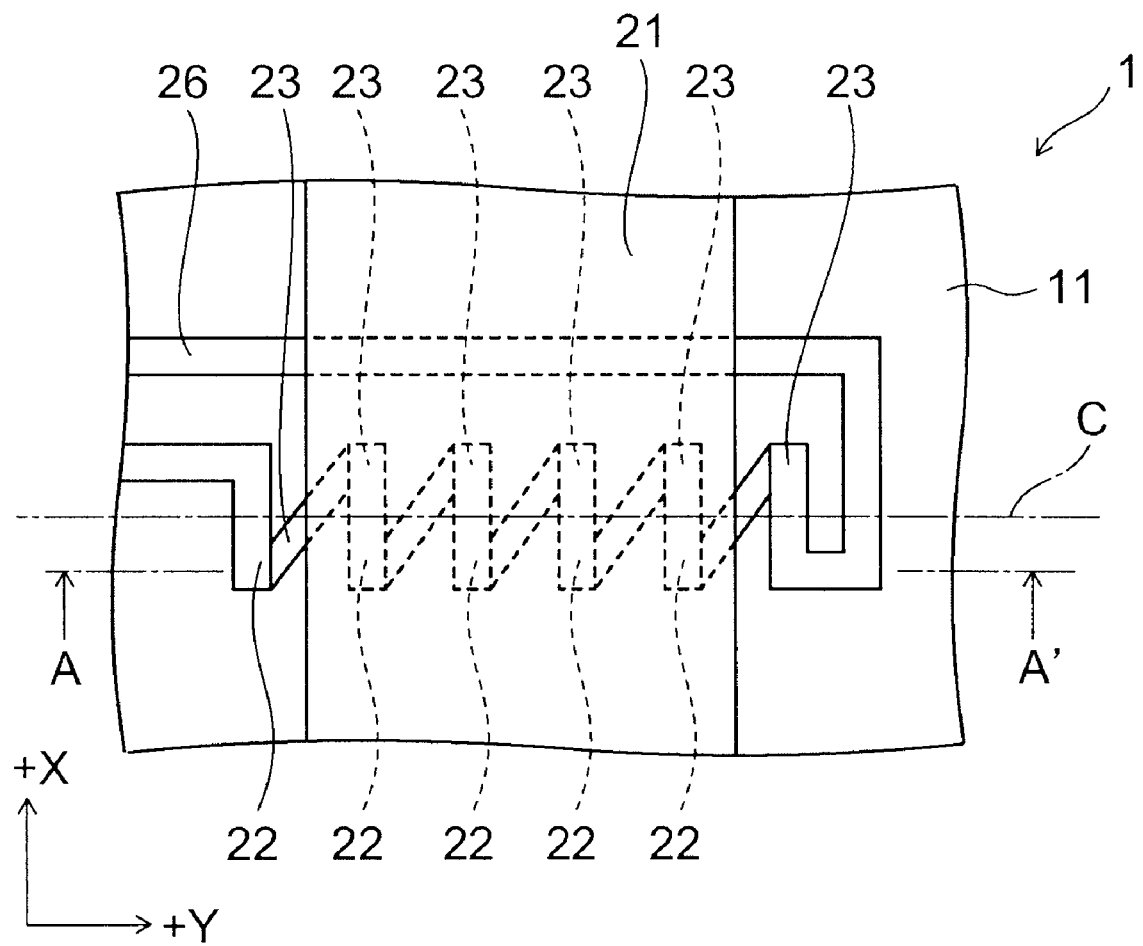
FIG. 1 is a plan view illustrating an integrated circuit device according to a first embodiment of the invention.

FIG. 1 is a plan view illustrating an integrated circuit device according to this embodiment.

Figure 2:
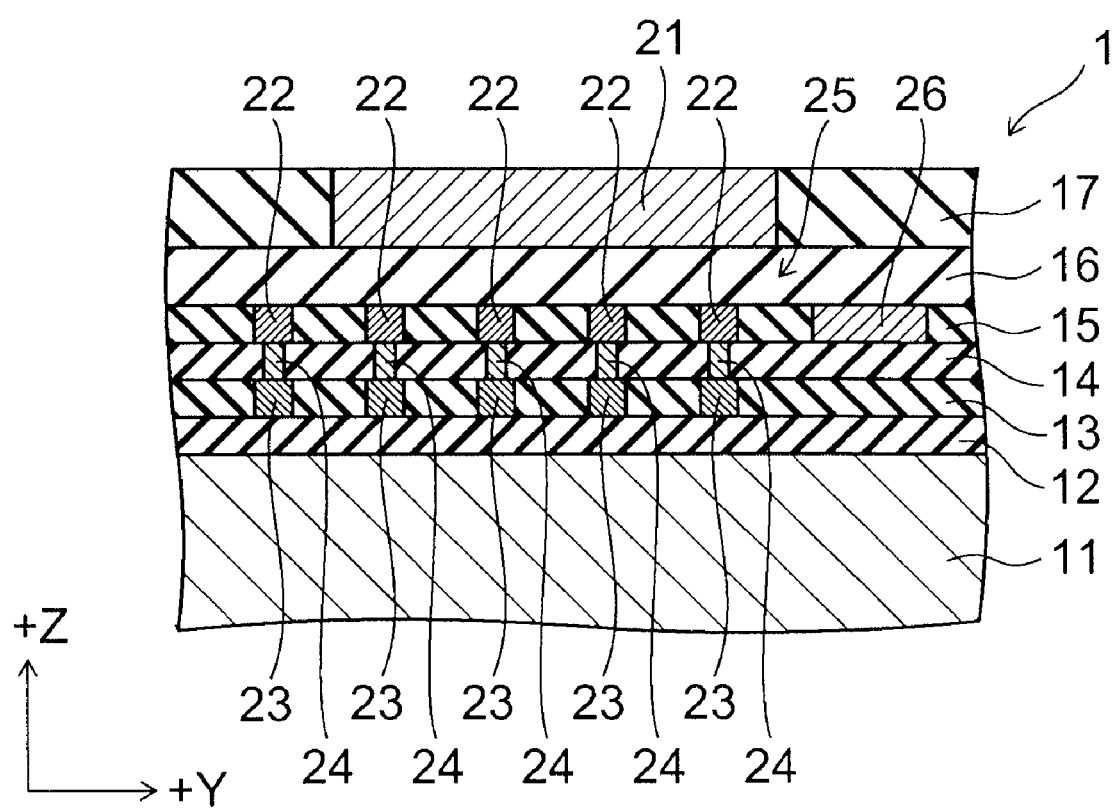
FIG. 2 is a cross-sectional view taken along line A-A' shown in FIG. 1.

FIG. 2 is a cross-sectional view taken along line A-A' shown in FIG. 1.

Figure 3:
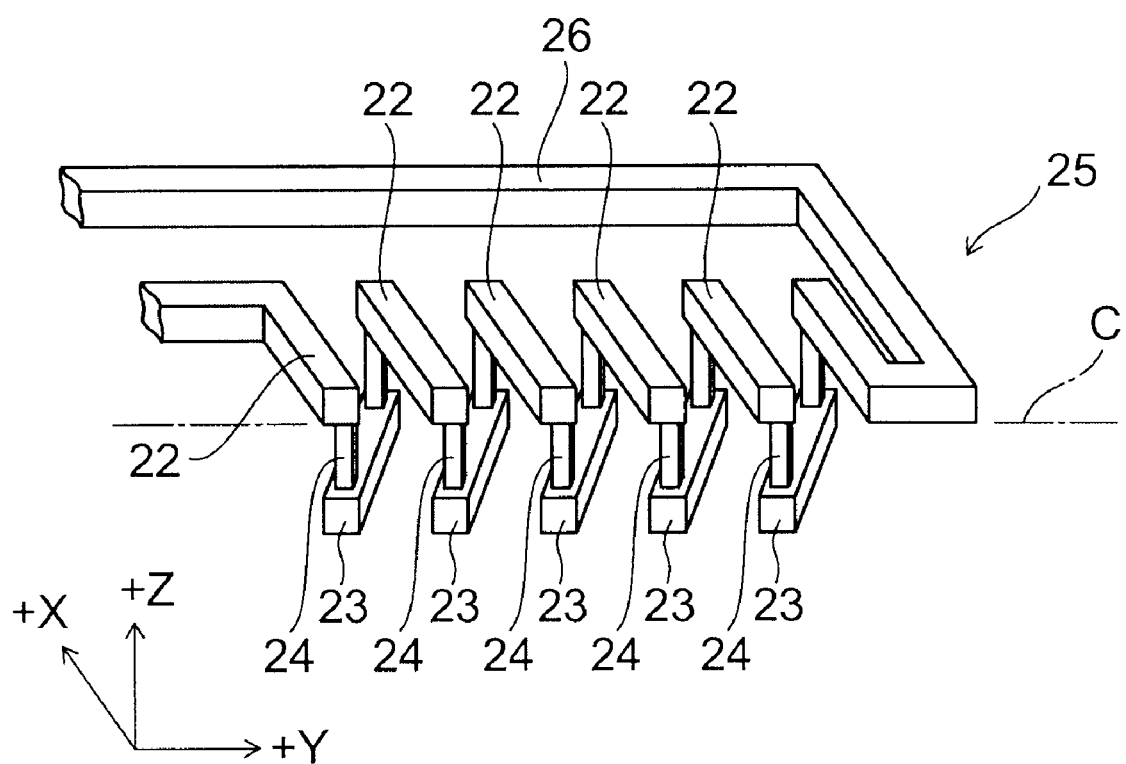
FIG. 3 is a perspective view illustrating a coil of the first embodiment.

FIG. 3 is a perspective view illustrating a coil of this embodiment.

As shown in FIGS. 1 to 3, the integrated circuit device 1 according to this embodiment includes a substrate 11. The substrate 11 is illustratively a semiconductor substrate, illustratively formed from single crystal silicon. On the substrate 11, an insulating layer 12, an interconnect layer 13 (first interconnect layer), an insulating layer 14 (first insulating layer), an interconnect layer 15 (second interconnect layer), an insulating layer 16 (second insulating layer), and an interconnect layer 17 (third interconnect layer) are laminated in this order. Each interconnect layer includes an interconnect made of a metal or an alloy, which is buried in an insulating material. Each insulating layer is formed from an insulating material, and vias are embedded therein. The via connects between the interconnects formed in the overlying and underlying interconnect layer. These configurations are fabricated by a semiconductor process.

In the following, the configuration of the layers is described in detail. In this disclosure, for convenience of description, two mutually orthogonal directions parallel to the surface of the substrate 11 and the layers are referred to as X direction (first direction) and Y direction (second direction). The direction orthogonal to the surface of the substrate 11 and the layers, that is, the lamination direction of the layers, is referred to as Z direction.

The interconnect layer 17 includes a main interconnect 21 extending in the X direction. The interconnect layer 15 includes a plurality of strip-shaped interconnects 22 extending in the X direction. The interconnects 22 are periodically arrayed along the Y direction. Furthermore, the interconnect layer 13 includes a plurality of strip-shaped interconnects 23 extending in a direction between the X direction and the Y direction. The plurality of interconnects 23 are parallel to each other and periodically arrayed along the Y direction. Each interconnect 23 extends from the directly underlying region of one end of one interconnect 22 to the directly underlying region of the other end of an interconnect 22 next to the one interconnect 22. Furthermore, the insulating layer 14 includes a via 24 that connects the end of each interconnect 22 to the end of the interconnect 23 located directly below that end. Thus, a coil 25 is formed of a plurality of interconnects 22, a plurality of interconnects 23, and a plurality of vias 24. The coil 25 is located directly below the main interconnect 21.

The coil 25 is wound in the right-hand screw direction around the central axis C located in the insulating layer 14 and extending in the Y direction. The coil 25 is spaced and insulated from the main interconnect 21 by the insulating layer 16. An interconnect 26 formed in the interconnect layer 15 is connected to the +Y end of the coil 25. The interconnect 26 is detoured in a region on the +X side of the coil 25 and extracted to the −Y side. For convenience of illustration, FIGS. 1 and 3 do not show the insulating material forming the interconnect layers and insulating layers.

Next, the operation of this embodiment is described.

When a current flows through the main interconnect 21, a magnetic field is generated around the main interconnect 21 by Ampére's law. This magnetic field points in a direction wrapping around the main interconnect 21 in accordance with the so-called "right-hand screw rule". For example, if a current flows through the main interconnect 21 in the +X direction, a magnetic field pointing generally in the −Y direction is generated at the position of the coil 25. That is, a magnetic field is generated in the direction passing through the coil 25 along the central axis C of the coil 25. Thus, the magnetic field inside the coil 25 is varied to generate an induction current in the coil 25. By measuring this induction current, the magnitude of the current flowing through the main interconnect 21 can be measured.

Next, the effect of this embodiment is described.

According to this embodiment, the coil 25 is not in contact with the main interconnect 21. Hence, the current can be measured without consuming the voltage applied to the main interconnect 21. Consequently, the output current of a switching power supply IC with a low output voltage, for example, can be measured with high accuracy.

Furthermore, as described above, in the conventional method for measuring a current, a ring-shaped Rogowski coil is located so as to surround a target interconnect to be measured. This is intended to obtain a stable measurement value wherever in the Rogowski coil the target interconnect is located. It is also intended to exclude the effect of the external magnetic field. In contrast, in this embodiment, the main interconnect 21, which is a target interconnect to be measured, and the coil 25 are integrated on the same substrate 11, and the relative positional relationship therebetween is fixed. Hence, the induction current is free from variation due to the variation in the relative positional relationship therebetween. Furthermore, the main interconnect 21 and the coil 25 are separated from each other only by the insulating layer 16, and are located in very close proximity. Hence, a large induction current can be obtained, and the effect of external noise becomes relatively small. Consequently, even if the coil 25 is provided only on one side of the main interconnect 21, the magnitude of a current flowing through the main interconnect 21 can be accurately measured. Thus, the coil 25 can be formed from two interconnect layers, and even with the main interconnect 21 counted in, the coil 25 can be integrated therewith using three interconnect layers. That is, the main interconnect 21 and the coil 25 can be formed in any integrated circuit device as long as the number of laminations therein is three or more. For example, they can be integrated on an electrical circuit substrate or a semiconductor integrated circuit substrate.

Thus, in the integrated circuit device 1 according to this embodiment, the magnitude of a current flowing through the internal interconnect can be accurately measured with a simple configuration.

Next, a second embodiment of the invention is described.

Figure 4:
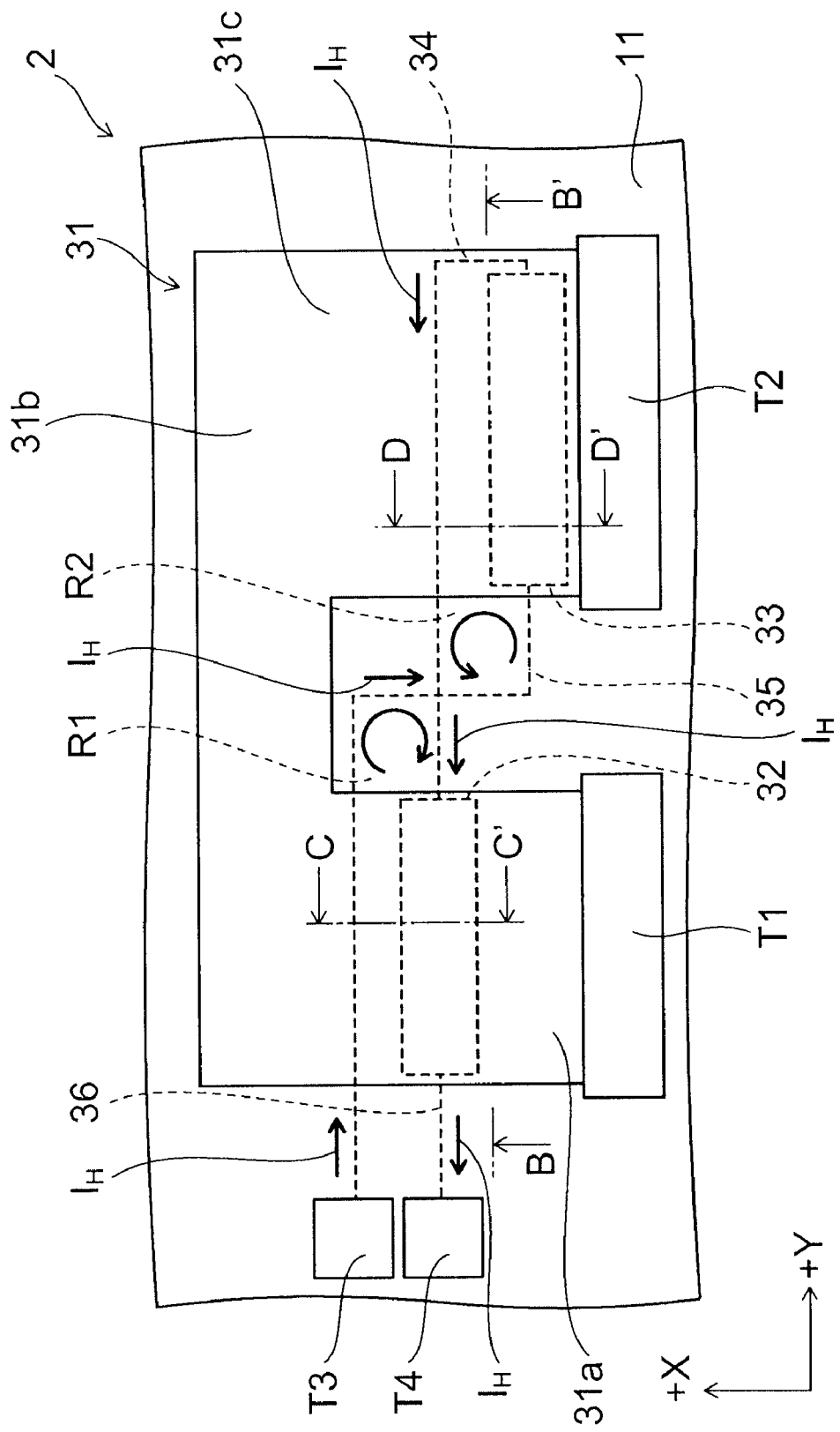
FIG. 4 is a plan view illustrating an integrated circuit device according to a second embodiment of the invention.

FIG. 4 is a plan view illustrating an integrated circuit device according to this embodiment.

Figure 5A:
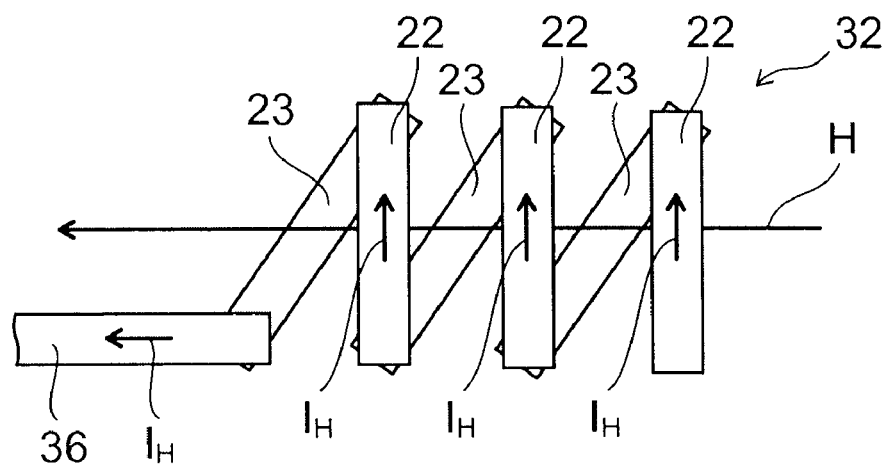
FIG. 5A is a plan view illustrating the coil 32 shown in FIG. 4.
Figure 5B:
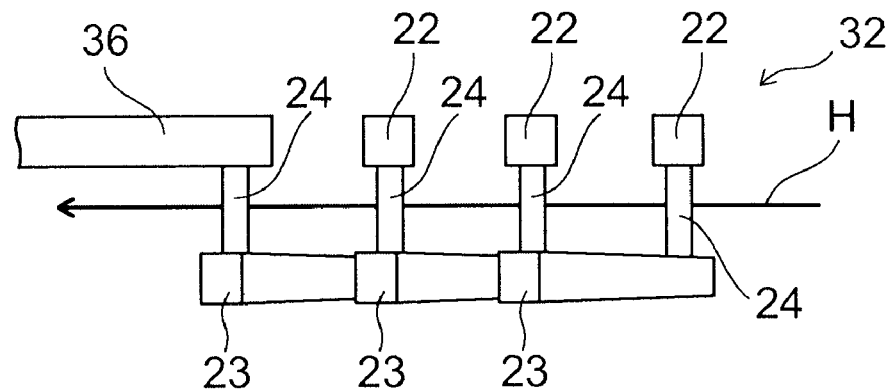
FIG. 5B is a side view thereof.

FIG. 5A is a plan view illustrating the coil 32 shown in FIG. 4, and FIG. 5B is a side view thereof.

Figure 6A:
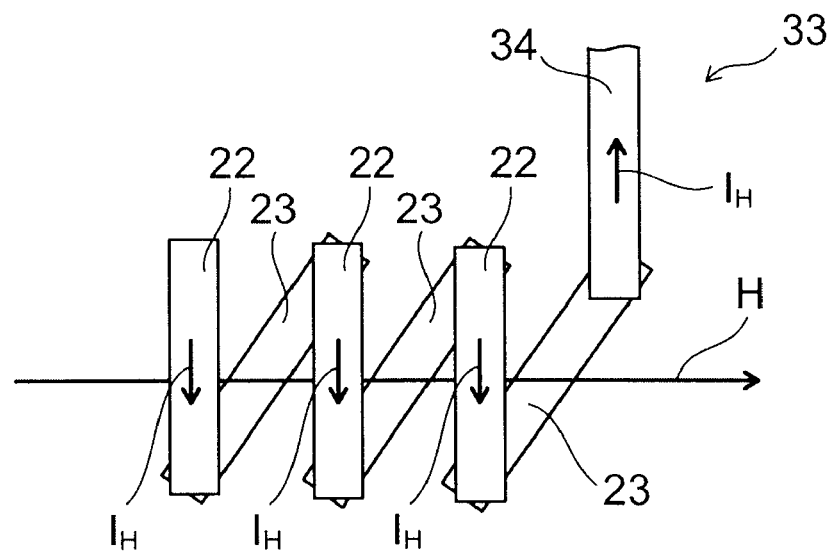
FIG. 6A is a plan view illustrating the coil 33 shown in FIG. 4.
Figure 6B:
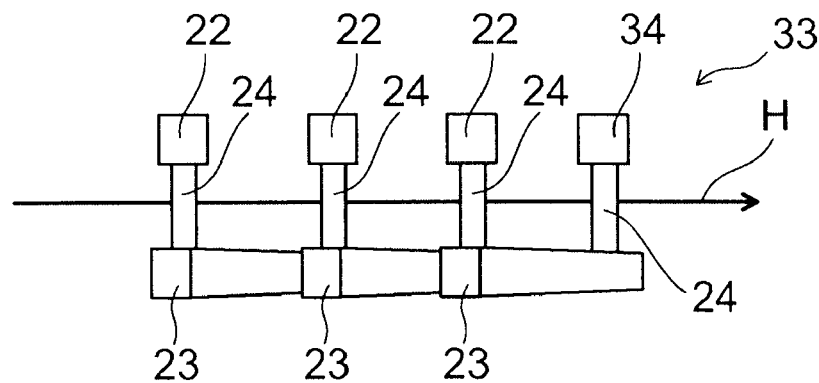
FIG. 6B is a side view thereof.

FIG. 6A is a plan view illustrating the coil 33 shown in FIG. 4, and FIG. 6B is a side view thereof.

Figure 7:
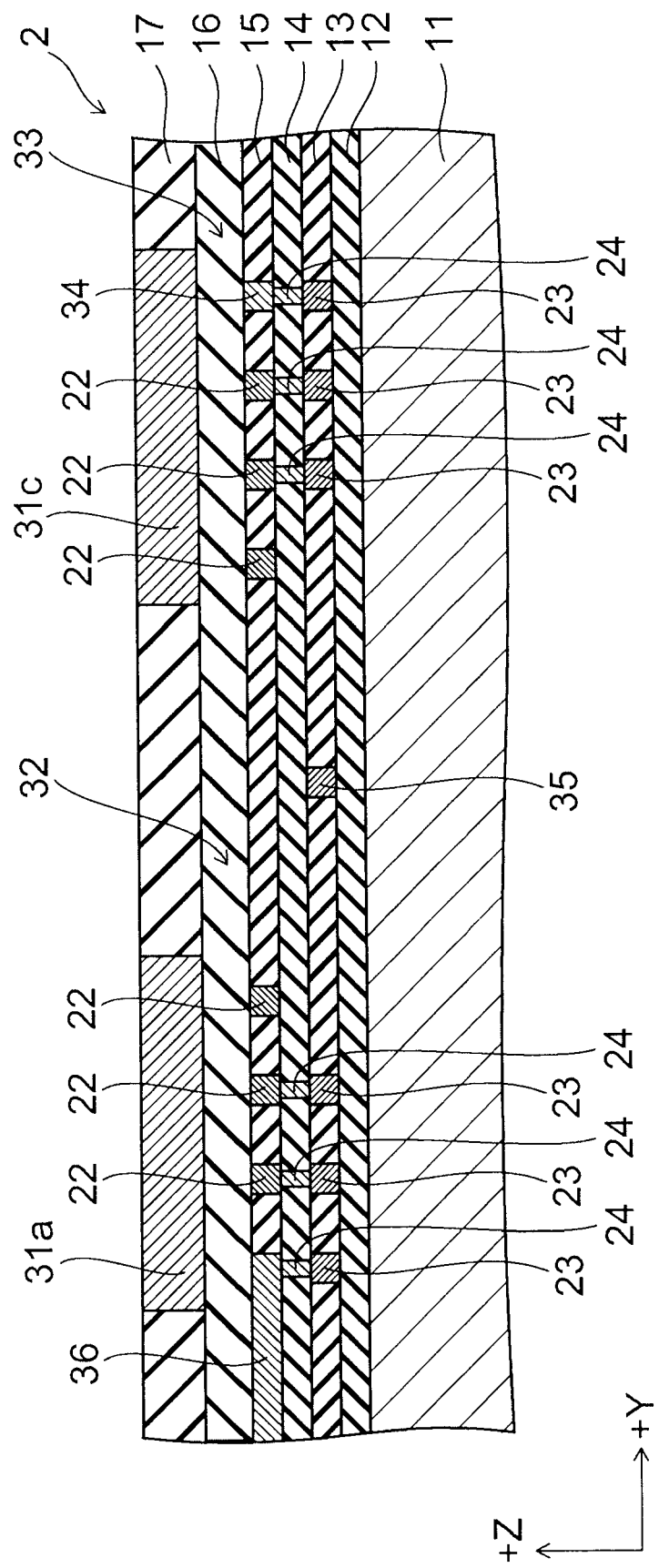
FIG. 7 is a cross-sectional view taken along line B-B' shown in FIG. 4.

FIG. 7 is a cross-sectional view taken along line B-B' shown in FIG. 4.

The lamination structure of the integrated circuit device 2 according to this embodiment is similar to that of the above first embodiment. More specifically, as shown in FIG. 7, an insulating layer 12, an interconnect layer 13, an insulating layer 14, an interconnect layer 15, an insulating layer 16, and an interconnect layer 17 are laminated in this order on a substrate 11. This lamination structure is formed by a semiconductor process.

As shown in FIG. 4, the interconnect layer 17 includes a main interconnect 31 having a square U shape. More specifically, the interconnect 31 includes a section 31a extending in the +X direction, a section 31b extending in the +Y direction from the +X end of the section 31a, and a section 31c extending in the −X direction from the +Y end of the section 31b. The section 31a and the section 31c are spaced from each other. Furthermore, terminals T1 and T2 are connected to the respective ends of the main interconnect 31. The terminal T1 is connected to the section 31a, and the terminal T2 is connected to the section 31c.

Furthermore, the integrated circuit device 2 includes two coils 32 and 33. The coil 32 is located directly below the section 31a of the main interconnect 31, and the coil 33 is located directly below the section 31c. The position of the coil 32 and the position of the coil 33 in the X direction are displaced a distance of approximately one coil, for example.

As shown in FIGS. 5A, 5B, 6A, and 6B, the coils 32 and 33 have the same configuration as the coil 25 in the above first embodiment. That is, the coils 32 and 33 are each composed of interconnects 22, interconnects 23, and vias 24, and wound in the right-hand screw direction around the central axis extending in the Y direction.

Furthermore, as shown in FIG. 4, the interconnect layer 15 includes an interconnect 34. As viewed from above, that is, from the +Z direction, the interconnect 34 has a generally L shape. More specifically, the interconnect 34 is linearly extracted from the +Y end of the coil 32 in the +Y direction, passed through a region on the +X side of the coil 33, then bent in the −X direction, and reaches the +Y end of the coil 33. Thus, the interconnect 34 connects the end of the coil 32 on the section 31c side to the +Y end of the coil 33, that is, the end on the side farther from the section 31a. Here, the interconnect 34 can be routed in a region on the +Y side of the coil 33, but is fitted inside a region on the −Y side of the +Y edge of the section 31c.

Furthermore, the interconnect layer 13 includes an interconnect 35. As viewed from above, the interconnect 35 has an S shape. More specifically, the interconnect 35 is extracted from the −Y end of the coil 33 in the −Y direction, bent at a right angle between the section 31a and the section 31c, extended in the +X direction, bent again at a right angle before reaching the section 31b, extended in the −Y direction, passed through a region on the +X side of the coil 32, and reaches a terminal T3, which is located on the −Y side of the section 31a. Thus, one end of the interconnect 35 is connected to the −Y end of the coil 33, that is, to the end on the section 31a side, and the other end is extracted to the side (−Y side) of the section 31a farther from the section 31c.

Furthermore, the interconnect layer 15 includes an interconnect 36. The interconnect 36 is extracted from the −Y end of the coil 32 in the −Y direction and reaches a terminal T4, which is provided on the −Y side thereof. Thus, the interconnect 36 connects the −Y end of the coil 32 to the terminal T4.

As shown in FIG. 4, as viewed from above, the interconnect 34 and the interconnect 35 intersect in a region between the section 31a and the section 31c of the main interconnect 31 and constitute a twisted interconnect. As viewed from above, the area of the region R1 enclosed by the section 31a of the main interconnect 31, the interconnect 34, and the interconnect 35 is equal to the area of the region R2 enclosed by the section 31c of the main interconnect 31, the interconnect 34, and the interconnect 35

Next, the operation of this embodiment is described.

Figure 8:
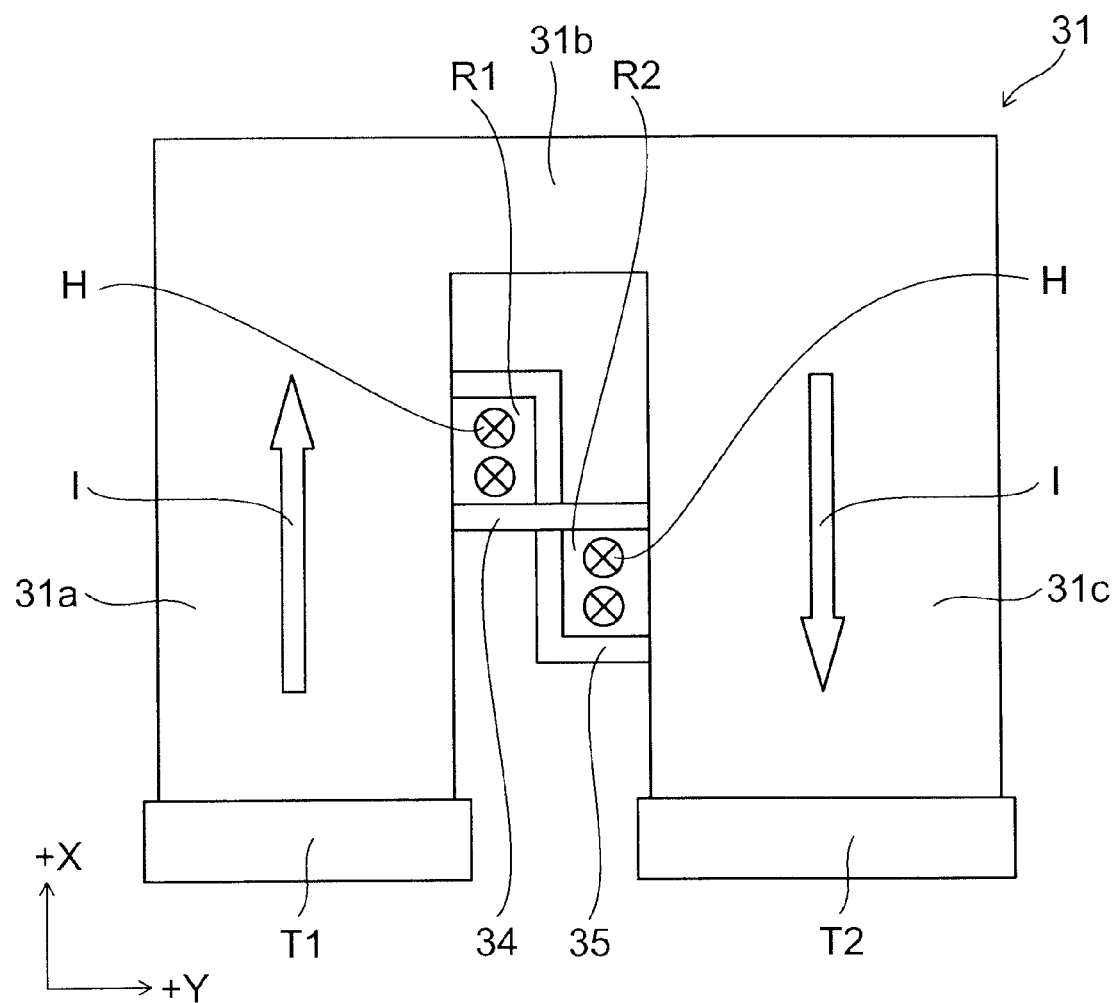
FIG. 8 is a plan view illustrating the operation of the second embodiment.

FIG. 8 is a plan view illustrating the operation of this embodiment.

Figure 9:
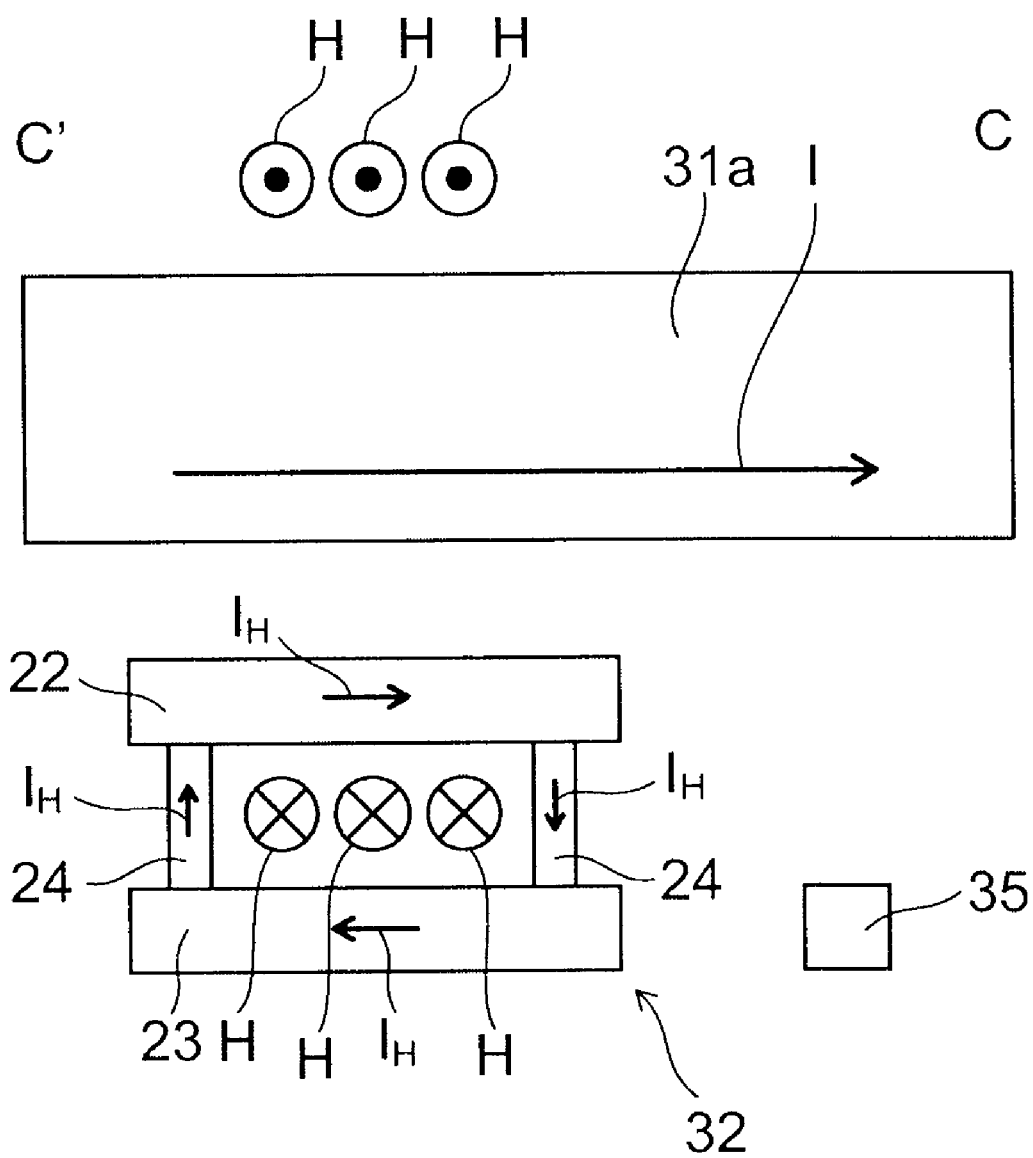
FIG. 9 is a cross-sectional view taken along line C-C' shown in FIG. 4.

FIG. 9 is a cross-sectional view taken along line C-C' shown in FIG. 4.

Figure 10:
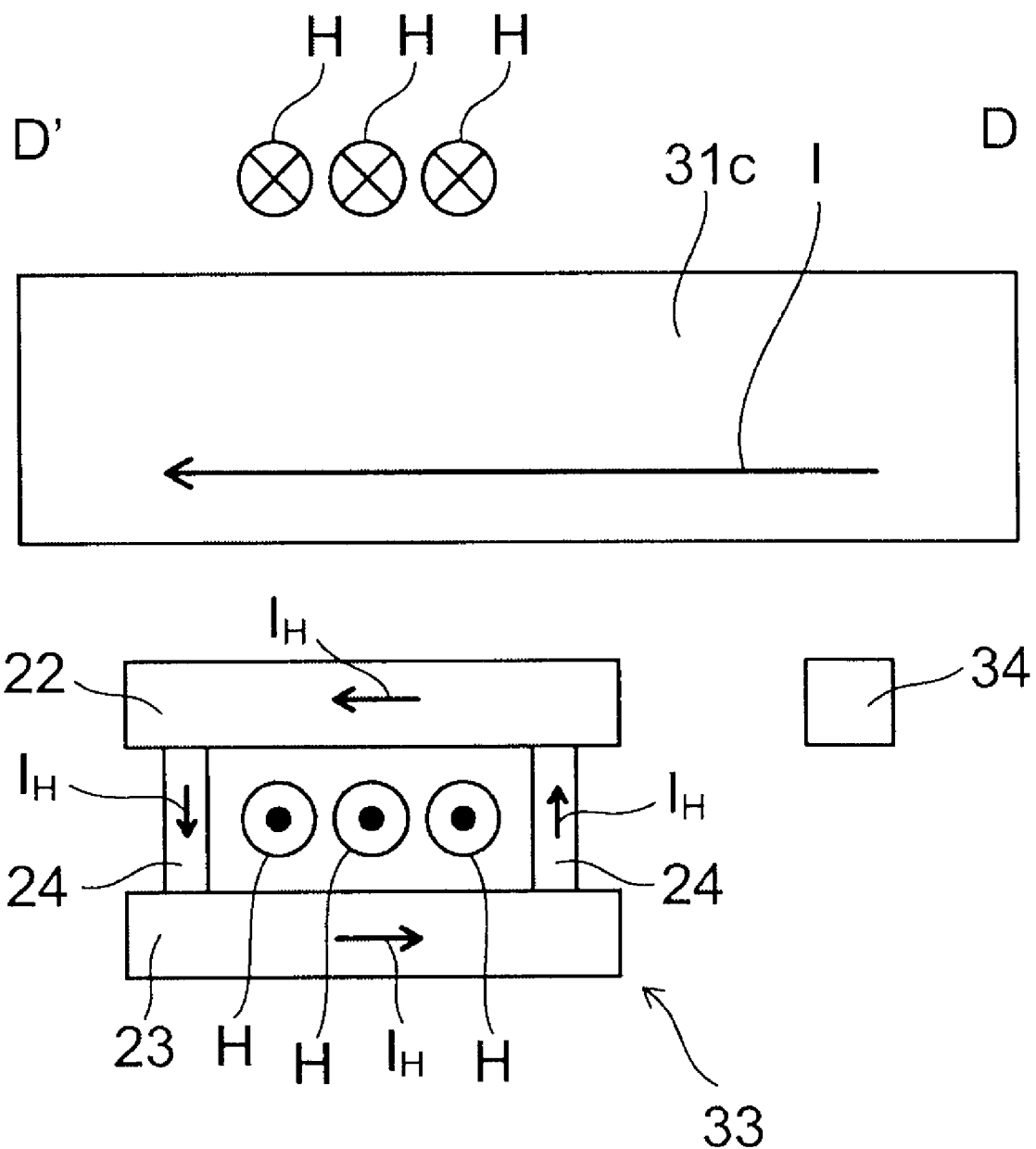
FIG. 10 is a cross-sectional view taken along line D-D' shown in FIG. 4.

FIG. 10 is a cross-sectional view taken along line D-D' shown in FIG. 4.

For clarity of the drawings, FIGS. 8 to 10 do not show members other than the interconnects, vias, and terminals.

As shown in FIG. 8, when a current I starts to flow through the main interconnect 31 from the terminal T1 toward the terminal T2, a magnetic field H is generated around the main interconnect 31 by Ampére's law and passes through the coils 32 and 33. Here, the direction of the magnetic field H obeys the right-hand screw rule. Hence, as shown in FIG. 9, the magnetic field H passing through the coil 32 points in the −Y direction, that is, the direction from the front to the back of the page in FIG. 9. On the other hand, as shown in FIG. 10, the magnetic field H passing through the coil 33 points in the +Y direction, that is, the direction from the back to the front of the page in FIG. 10.

Thus, as shown in FIGS. 9 and 10, an electromotive force is generated in the coils 32 and 33. This electromotive force is proportional to the differential of the current I. Hence, the differential of the current I can be integrated using the electromotive force, and the magnitude of the current I flowing through the interconnect 31 can be measured.

Furthermore, as shown in FIG. 8, when the current I flows through the main interconnect 31 from the terminal T1 toward the terminal T2, the magnetic field H passes through each of the regions R1 and R2 in the −Z direction. However, the direction of the induction current generated in the interconnects 34 and 35 by the magnetic field H passing through the region R1 is opposite to the direction of the induction current generated in the interconnects 34 and 35 by the magnetic field H passing through the region R2. In addition, because the area of the region R1 and the area of the region R2 are equal to each other, the electromotive forces generated therein are also equal to each other. Consequently, the electromotive force generated by the magnetic field H passing through the region R1 and the electromotive force generated by the magnetic field H passing through the region R2 cancel out.

Furthermore, even if the magnetic field outside the integrated circuit device 2 varies, the electromotive force generated by the magnetic field H passing through the region R1 and the electromotive force generated by the magnetic field H passing through the region R2 are equal in magnitude and opposite in direction. Hence, these effects of the external magnetic field also cancel out.

Next, the effect of this embodiment is described.

In this embodiment, as described above, a pair of coils 32 and 33 are located directly below the sections 31a and 31c, respectively. Hence, the effect of the external magnetic field can be blocked. Furthermore, like the above first embodiment, the main interconnect 31 and the coils 32 and 33 are integrated on the same substrate 11, and the relative positional relationship therebetween is fixed. Hence, the magnitude of the induction current is free from variation due to the variation in the relative positional relationship therebetween. Thus, even if the coils 32 and 33 are provided only on the lower side of the main interconnect 31, it is possible to achieve the same effect as a Rogowski coil provided entirely around the main interconnect 31. Consequently, the magnitude of a current flowing through the main interconnect 31 can be accurately measured.

Furthermore, as described above, in this embodiment, the main interconnect 31 is formed into a square U shape, and provided with a pair of coils in a pair of portions where the current in the main interconnect 31 has opposite directions, that is, in the region R1 and the region R2. Hence, there is no need to provide a return lead as in a conventional Rogowski coil to cancel the external magnetic field. Thus, the coils 32 and 33 can be formed from two interconnect layers, and even with the main interconnect 31 counted in, the configuration of this embodiment can be realized by three interconnect layers. Consequently, this embodiment is applicable to any integrated circuit device as long as the number of laminations therein is three or more, and the magnitude of a current flowing through the internal interconnect can be accurately measured with a simple configuration.

Furthermore, also in this embodiment, like the above first embodiment, the main interconnect 31 and the coils 32 and 33 are separated from each other only by the insulating layer 16, and are located in very close proximity. Hence, a large induction current can be obtained. Furthermore, the current flowing through the main interconnect 31 can be measured in a non-contact manner. Hence, the voltage applied to the main interconnect 31 is not consumed, and this embodiment is also applicable to an integrated circuit device driven at a low voltage. Thus, in the integrated circuit device 2 according to this embodiment, the magnitude of a current flowing through the internal interconnect can be accurately measured with a simple configuration.

In the example of the above first and second embodiment, a coil is provided on the substrate, and a main interconnect is provided on the coil. However, the invention is not limited thereto. The main interconnect can be provided on the substrate, and the coil can be provided on the main interconnect. Alternatively, the coil can be provided on the lateral side of the main interconnect.

Next, a third embodiment of the invention is described.

Figure 11:
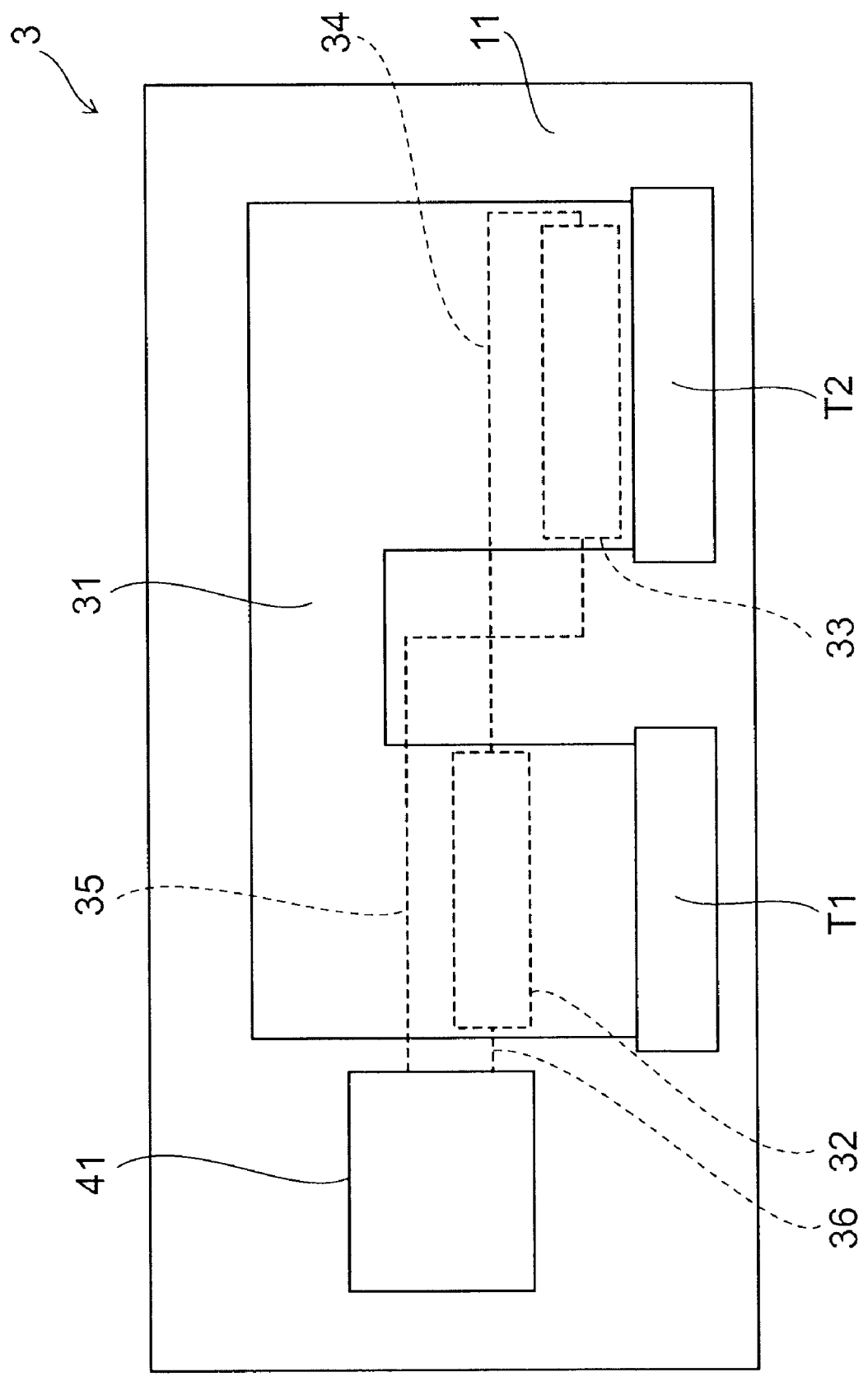
FIG. 11 is a plan view illustrating an integrated circuit device according to a third embodiment of the invention.

FIG. 11 is a plan view illustrating an integrated circuit device according to this embodiment.

As shown in FIG. 11, the integrated circuit device 3 according to this embodiment is a semiconductor IC chip. In addition to the configuration of the integrated circuit device 2 (see FIG. 4) according to the above second embodiment, the integrated circuit device 3 includes an integrating circuit 41 on the substrate 11. The integrating circuit 41 is formed in conjunction with the main interconnect 31 and the induction current path on the substrate 11 by a multilayer interconnection CMOS (complementary metal oxide semiconductor) process. The integrating circuit 41 is connected to the interconnects 35 and 36 and integrates the above-described differential value of the current I flowing through the main interconnect 31 as determined from the electromotive force of the coils 32 and 33. The integration result corresponds to the magnitude of the current I flowing through the main interconnect 31.

According to this embodiment, the electromotive force of the coils 32 and 33 is inputted to the integrating circuit 41, which integrates the differential value of the current I flowing through the main interconnect 31 as determined from this electromotive force. Thus, the magnitude of the current I can be measured. Furthermore, the multilayer interconnection CMOS process allows the main interconnect 31, the induction current path including the coils 32 and 33, and the integrating circuit 41 to be formed monolithically. Thus, a single semiconductor IC chip can serve to output a current and measure the magnitude of this current. The configuration, operation, and effect in this embodiment other than the foregoing are the same as those in the above second embodiment.

This embodiment can also include a correction circuit on the substrate 11 to correct the operation of the integrating circuit 41. This correction circuit illustratively includes a fuse for adjusting the resistance value. The fuse is illustratively a polysilicon film, which can be partly burned out by laser light to adjust the resistance value after the integrated circuit device 3 is fabricated.

Next, a fourth embodiment of the invention is described.

Figure 12:
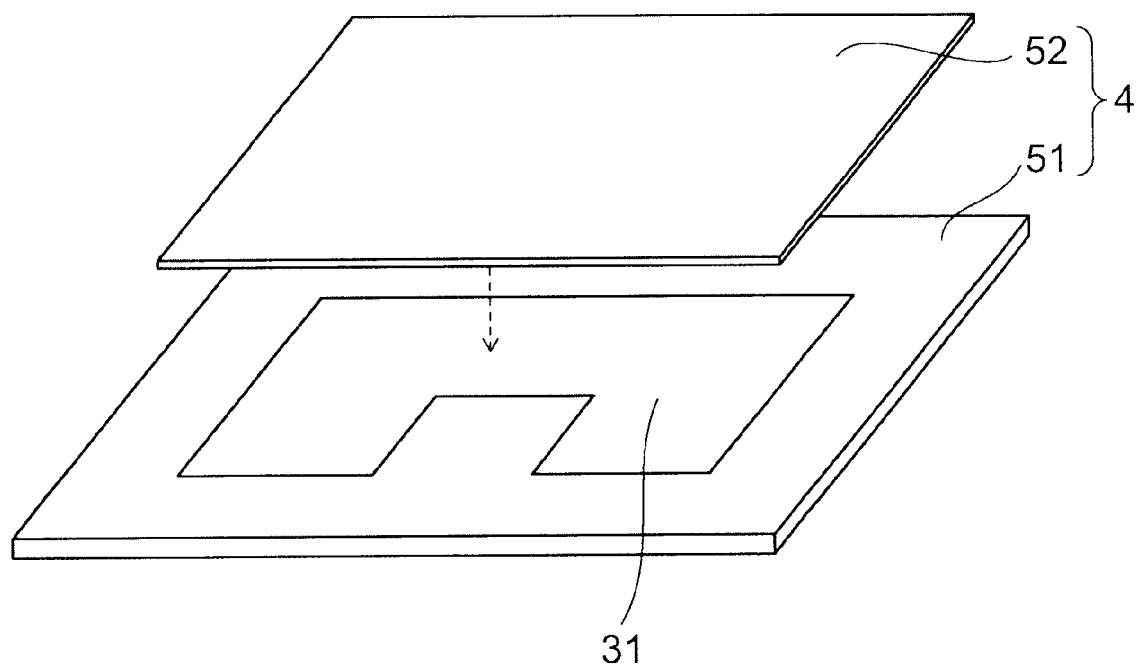
FIG. 12 is an exploded perspective view illustrating an integrated circuit device according to a fourth embodiment of the invention.

FIG. 12 is an exploded perspective view illustrating an integrated circuit device according to this embodiment.

Figure 13:
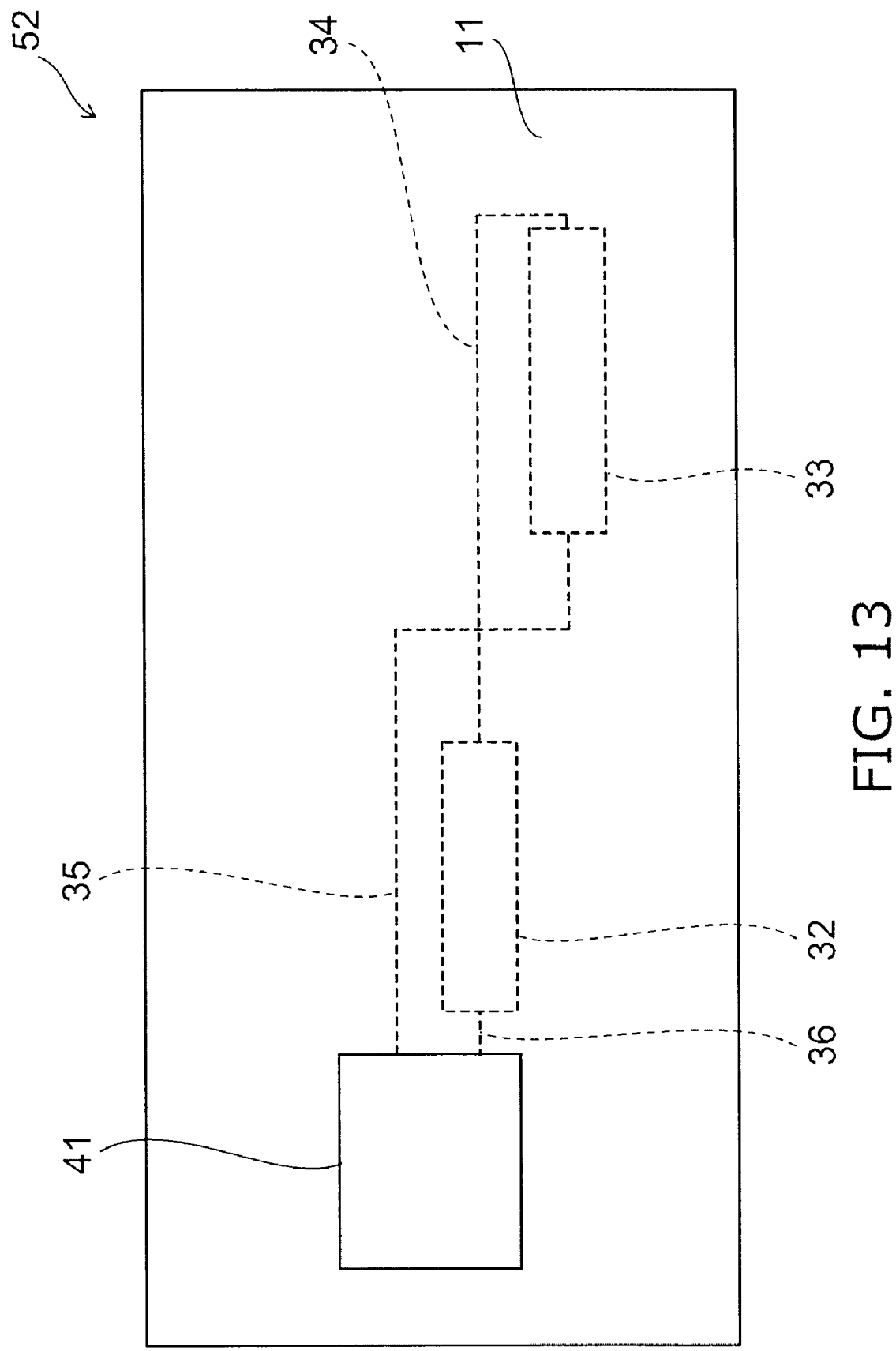
FIG. 13 is a plan view illustrating the semiconductor IC chip shown in FIG. 12.

FIG. 13 is a plan view illustrating the semiconductor IC chip shown in FIG. 12.

As shown in FIG. 12, the integrated circuit device 4 according to this embodiment includes a circuit substrate 51 and a semiconductor IC chip 52. The semiconductor IC chip 52 is mounted on the circuit substrate 51 illustratively by flip chip connection.

The circuit substrate 51 is illustratively made of FR4 (Frame Retardant Type 4). A main interconnect 31 constituting the main circuit of the circuit substrate 51 is formed on the surface of the circuit substrate 51. On the other hand, as shown in FIG. 13, the semiconductor IC chip 52 has the same configuration as the integrated circuit device 3 (see FIG. 11) according to the above third embodiment except that the main interconnect 31 is omitted. That is, the semiconductor IC chip 52 includes a substrate 11, and the integrating circuit 41 and the induction current path including the coils 32 and 33 are provided on the surface of this substrate 11 opposed to the circuit substrate 51. The circuit substrate 51 and the semiconductor IC chip 52 are flip-chip connected. Hence, the coils 32 and 33 are located on one side of the main interconnect 31 at fixed positions with respect thereto. As viewed in the direction perpendicular to the surface of the circuit substrate 51, the positional relationship between the main interconnect 31 formed on the circuit substrate 51 and the coils 32 and 33 formed in the semiconductor IC chip 52 is the same as that in the above second embodiment.

Next, the operation of this embodiment is described.

When a current flows through the main interconnect 31 of the circuit substrate 51, a magnetic field generated by this current passes through the coils 32 and 33 of the semiconductor IC chip 52 and generates an electromotive force. The integrating circuit 41 integrates this electromotive force (which is proportional to the differential of the current I). Thus, the magnitude of the current flowing through the main interconnect 31 can be measured without insertion of a sensing component into the main circuit of the circuit substrate 51. Here, the position of the coils 32 and 33 is fixed with respect to the main interconnect 31. Hence, even if the coils 32 and 33 are located on one side of the main interconnect 31, the current flowing through the main interconnect 31 can be accurately measured. The configuration, operation, and effect in this embodiment other than the foregoing are the same as those in the above third embodiment.

Next, a fifth embodiment of the invention is described.

Figure 14:
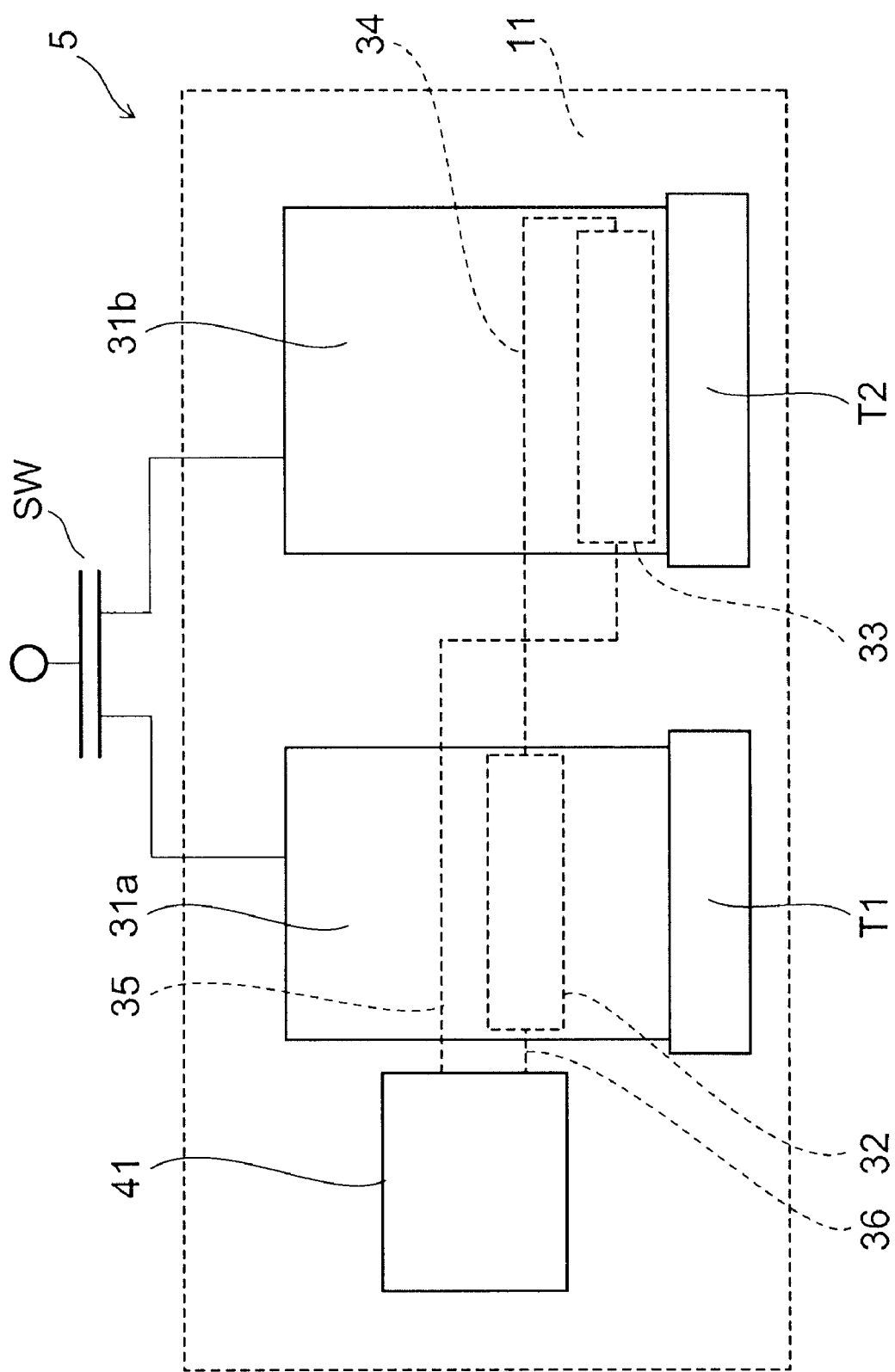
FIG. 14 is a plan view illustrating an integrated circuit device according to a fifth embodiment of the invention.

FIG. 14 is a plan view illustrating an integrated circuit device according to this embodiment.

As shown in FIG. 14, the integrated circuit device 5 according to this embodiment has the same configuration as the integrated circuit device 3 (see FIG. 11) according to the above third embodiment except that the section 31b of the main interconnect 31 is omitted, and that a semiconductor switch SW is connected between the section 31a and the section 31c of the main interconnect 31. The semiconductor switch SW is not integrated on the substrate 11, but constitutes a separate element. The integrated circuit device 5 serves as a switching power supply. Thus, according to this embodiment, the magnitude of the current flowing through the semiconductor switch SW can be measured. The configuration, operation, and effect in this embodiment other than the foregoing are the same as those in the above third embodiment.

Next, a sixth embodiment of the invention is described.

Figure 15:
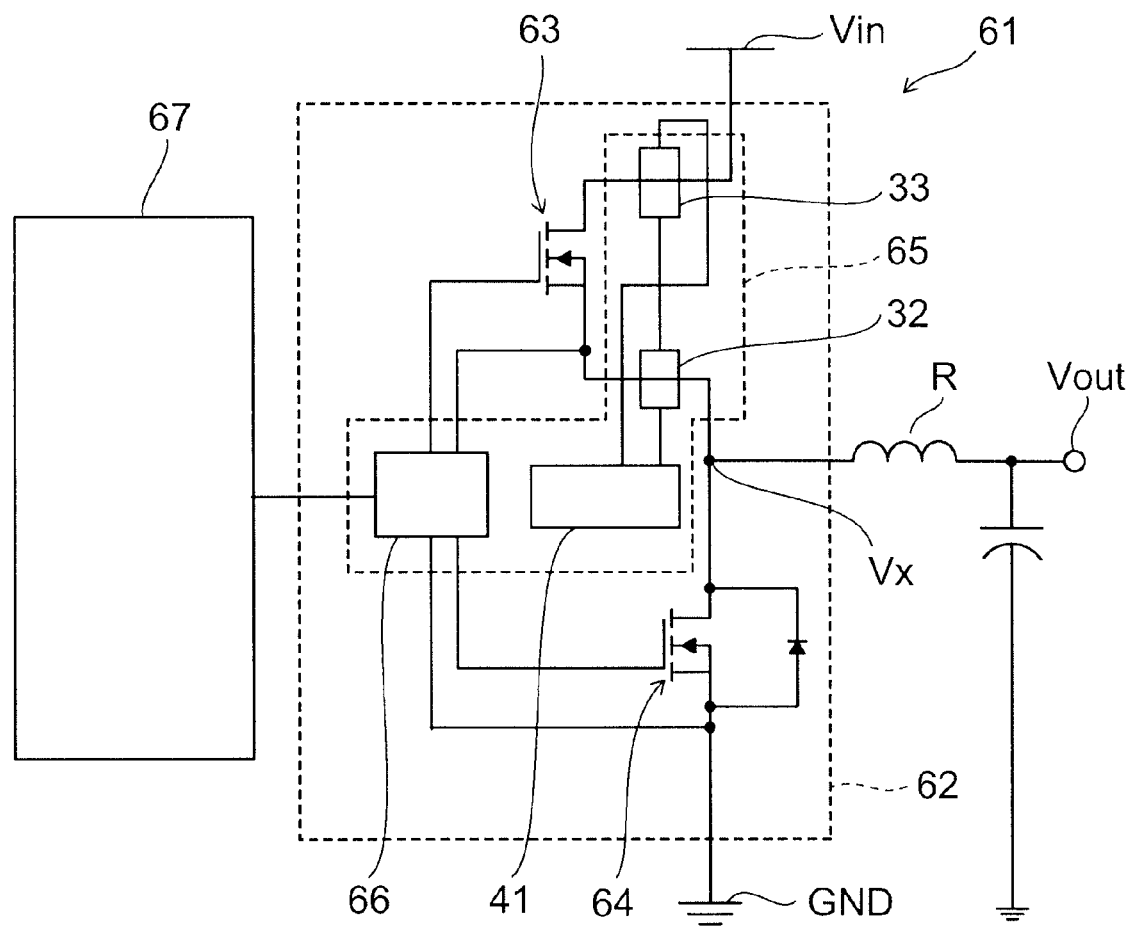
FIG. 15 is a plan view illustrating an integrated circuit device according to a sixth embodiment of the invention.

FIG. 15 is a plan view illustrating an integrated circuit device according to this embodiment.

As shown in FIG. 15, this embodiment is an example of the above fifth embodiment (see FIG. 14) in which the semiconductor switch SW (see FIG. 14) is a high-side MOSFET (metal oxide semiconductor field effect transistor).

The integrated circuit device according to this embodiment is a DC-DC converter multi-chip module (MCM) 61. In this MCM 61, a high-side MOSFET chip 63, a low-side MOSFET chip 64, and a semiconductor IC chip 65 are mounted on a substrate 62 illustratively made of FR4. The high-side MOSFET chip 63 and the low-side MOSFET chip 64 are series connected in this order between the power supply potential Vin and the ground potential GND, and the junction Vx therebetween is connected to an output terminal Vout through an inductor R.

In addition to the integrating circuit 41 and the induction current path including the coils 32 and 33, the semiconductor IC chip 65 includes a driver circuit 66 for controlling the high-side MOSFET chip 63 and the low-side MOSFET chip 64. The coils 32 and 33 are located near the source interconnect and the drain interconnect of the high-side MOSFET chip 63, respectively. The direction of the current flowing through the source interconnect and the direction of the current flowing through the drain interconnect are opposite to each other and orthogonal to the extending direction of the central axis of the coil 32 and the central axis of the coil 33.

The MCM 61 further includes a control IC 67 for receiving the output signal of the integrating circuit 41 and controlling the driver circuit 66 on the basis of this output signal. Thus, the control IC 67 controls the operation of the high-side MOSFET chip 63 on the basis of the result that the integrating circuit 41 has obtained by integrating the induction current generated in the coils 32 and 33. That is, on the basis of the measurement value of the output current of the MCM 61, this output current is controlled.

In this embodiment, by monitoring the current flowing through the high-side MOSFET chip 63, the magnitude of the output current of the MCM 61, that is, the current flowing from the junction Vx to the output terminal Vout, can be measured without insertion of a sensing component into the high-side MOSFET chip 63. On the basis of the magnitude of the current measured, the control IC 67 can control the high-side MOSFET chip 63 through the driver circuit 66 to adjust the magnitude of the output current of the MCM 61. Thus, the output current of the MCM 61 can be subjected to feedback control.

Furthermore, the position of the coils 32 and 33 formed in the semiconductor IC chip 65 is fixed with respect to the source interconnect and the drain interconnect of the high-side MOSFET chip 63 to be measured. Hence, the magnitude of the current flowing through the high-side MOSFET chip 63 can be accurately measured.

Furthermore, according to this embodiment, the high-side MOSFET chip 63 and the low-side MOSFET chip 64 are connected in series between the power supply potential Vin and the ground potential GND. Thus, it is possible to configure a switching power supply in which the current rapidly rises even with a small current. Hence, a sufficiently large electromotive force can be obtained in the coils 32 and 33, and the output current can be accurately measured. Such a switching power supply can be illustratively used as a low-voltage switching power supply having an output voltage of approximately 1 V, intended for personal computers.

Next, a seventh embodiment of the invention is described.

Figure 16:
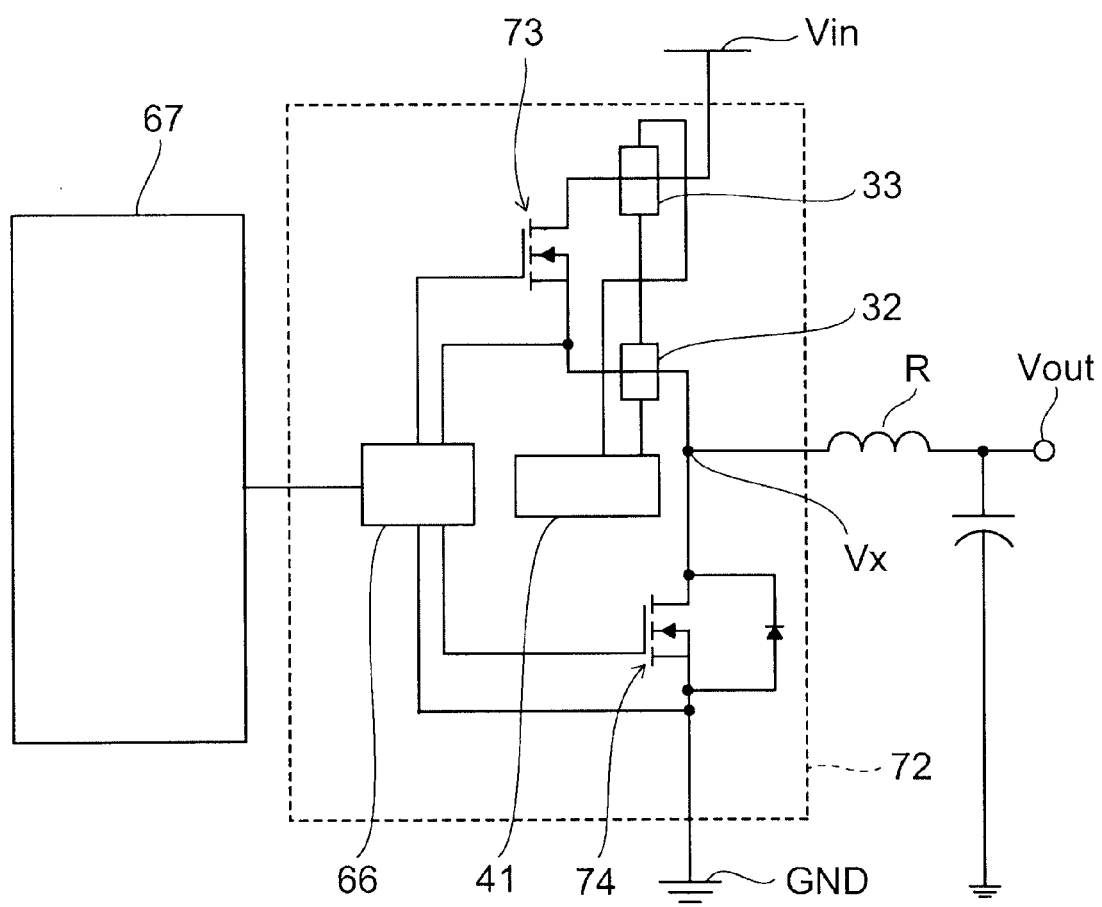
FIG. 16 is a plan view illustrating an integrated circuit device according to a seventh embodiment of the invention.

FIG. 16 is a plan view illustrating an integrated circuit device according to this embodiment.

As shown in FIG. 16, in this embodiment, a high-side MOSFET 73, a low-side MOSFET 74, an integrating circuit 41, and a driver circuit 66 are integrated on one chip 72. The configuration, operation, and effect in this embodiment other than the foregoing are the same as those in the above sixth embodiment.

Next, an eighth embodiment of the invention is described.

Figure 17:
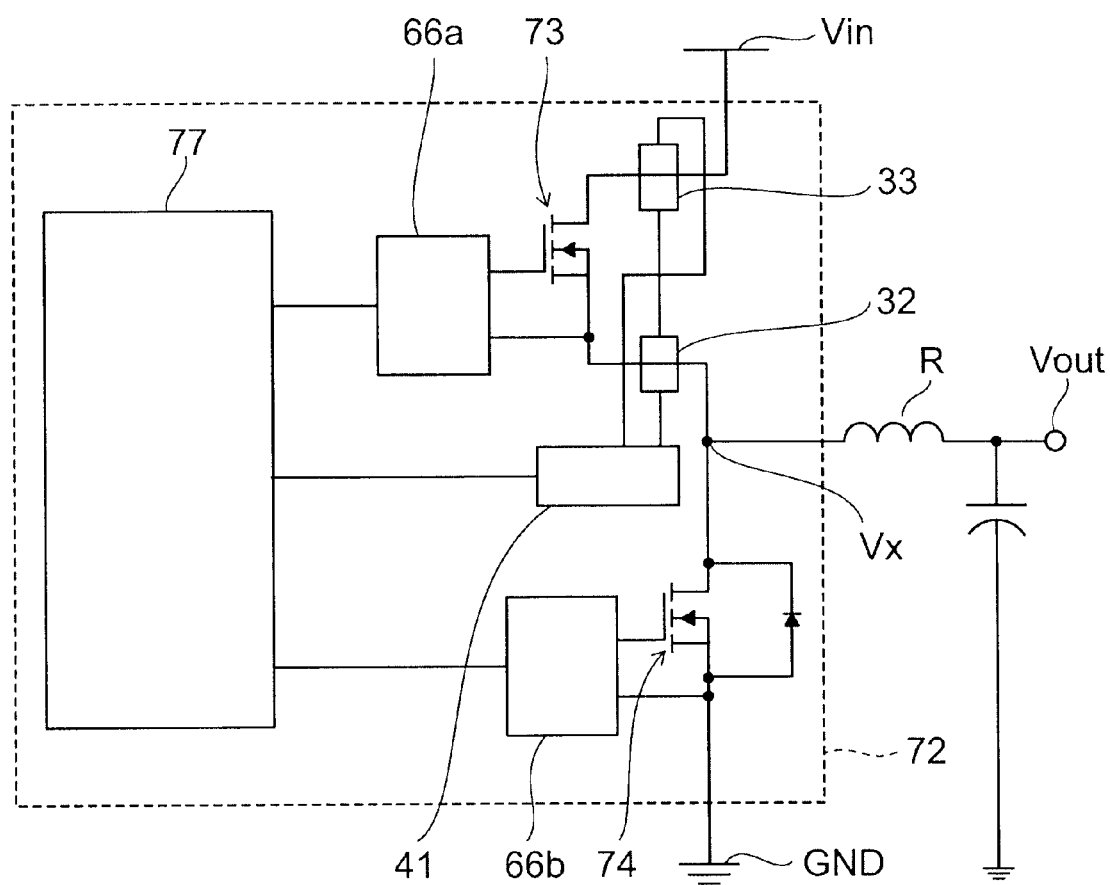
FIG. 17 is a plan view illustrating an integrated circuit device according to an eighth embodiment of the invention.

FIG. 17 is a plan view illustrating an integrated circuit device according to this embodiment.

As shown in FIG. 17, in this embodiment, a control circuit 77 is also integrated into the chip 72 in the above seventh embodiment. Furthermore, the driver circuit is split into a driver circuit 66a for controlling the high-side MOSFET 73 and a driver circuit 66b for controlling the low-side MOSFET 74. The configuration, operation, and effect in this embodiment other than the foregoing are the same as those in the above seventh embodiment.

The invention has been described with reference to the embodiments. However, the invention is not limited to these embodiments. For example, those skilled in the art can suitably modify the above embodiments through addition, deletion, and design change of components, and such modifications are also encompassed within the scope of the invention as long as they fall within the spirit of the invention.

The invention claimed is:

1. An integrated circuit device in which a first interconnect layer, a first insulating layer, a second interconnect layer, a second insulating layer, and a third interconnect layer are laminated in this order, the integrated circuit device comprising:

a main interconnect formed in the third interconnect layer and including a first section extending in a first direction parallel to a surface of the first interconnect layer and a second section extending in the opposite direction of the first direction;

a first coil made of an interconnect formed in the first interconnect layer, an interconnect formed in the second interconnect layer, and a via formed in the first insulating layer, the first coil being located directly below the first section and having a central axis extending in a second direction that is parallel to the surface of the first interconnect layer and orthogonal to the first direction;

a second coil made of an interconnect formed in the first interconnect layer, an interconnect formed in the second interconnect layer, and a via formed in the first insulating layer, the second coil being located directly below the second section and having a central axis extending in the second direction;

a first interconnect formed in one of the first interconnect layer and the second interconnect layer and connecting an end of the first coil on the second section side to an end of the second coil on the side farther from the first section; and a second interconnect formed in the other of the first interconnect layer and the second interconnect layer, one end of the second interconnect being connected to an end of the second coil on the first section side and the other end of the second interconnect being extracted to the side of the first section farther from the second section, the first coil having the same shape and winding direction as the second coil, and as viewed from a direction orthogonal to the surface of the first interconnect layer, the first interconnect crossing the second interconnect, and the area of a region enclosed by the first section, the first interconnect, and the second interconnect being equal to the area of a region enclosed by the second section, the first interconnect, and the second interconnect.

2. The device according to claim 1, further comprising:

a substrate on which the first interconnect layer, the first insulating layer, the second interconnect layer, the second insulating layer, and the third interconnect layer are laminated.

3. The device according to claim 2, wherein the substrate is a semiconductor substrate, and the first interconnect layer, the first insulating layer, the second interconnect layer, the second insulating layer, and the third interconnect layer are fabricated by a semiconductor process.

4. The device according to claim 3, further comprising:

a semiconductor switch not integrated on the substrate, the semiconductor switch being connected between the first section and the second section.

5. The device according to claim 2, further comprising:

an integrating circuit provided on the substrate and configured to integrate an induction current generated in the first coil due to a current flowing through the main interconnect.

6. The device according to claim 5, further comprising:

a switching element configured to switch on and off electric power supplied from a power supply interconnect to an output terminal; and a control circuit configured to control the switching element, wherein the control circuit controls the switching element on basis of a result that the integrating circuit has obtained by integrating the induction current.

7. The device according to claim 6, wherein the integrated circuit device is a DC-DC converter multi-chip module, and the switching element is a high-side transistor of the DC-DC converter multi-chip module.

8. The device according to claim 7, wherein a low-side transistor of the DC-DC converter multi-chip module, the high-side transistor, and the integrating circuit are integrated on the substrate.

* * * * *